(12) United States Patent
Ohmi et al.

(10) Patent No.: US 7,374,620 B2
(45) Date of Patent: May 20, 2008

(54) SUBSTRATE PROCESSING APPARATUS

(75) Inventors: Tadahiro Ohmi, Miyagi (JP); Masaki Hirayama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 64 days.

(21) Appl. No.: 10/555,770

(22) PCT Filed: Apr. 26, 2004

(86) PCT No.: PCT/JP2004/005977

§ 371 (c)(1),
(2), (4) Date: Dec. 22, 2005

(87) PCT Pub. No.: WO2004/100248

PCT Pub. Date: Nov. 18, 2004

(65) Prior Publication Data

US 2006/0213436 A1   Sep. 28, 2006

(30) Foreign Application Priority Data

May 8, 2003   (JP) ............... 2003-130544

(51) Int. Cl.
*C23C 16/00* (2006.01)
*C23C 16/455* (2006.01)
*C23F 1/08* (2006.01)

(52) U.S. Cl. ............... 118/715; 118/723 E; 118/723 R; 118/722; 118/723 I; 118/733; 156/345.29; 156/345.48

(58) Field of Classification Search ............... 118/715, 118/723 MW, 723 R, 733, 723 E, 722, 723 I; 156/345.29, 345.48
See application file for complete search history.

(56) References Cited

U.S. PATENT DOCUMENTS 5,271,963 A * 12/1993 Eichman et al. ......... 427/248.1
5,651,826 A * 7/1997 Takagi ..................... 118/724
5,834,730 A * 11/1998 Suzuki et al. ........... 219/121.43
5,922,223 A   7/1999 Okumura et al.
6,129,808 A * 10/2000 Wicker et al. ........... 156/345.1
6,375,860 B1 * 4/2002 Ohkawa et al. ............ 216/71
6,394,026 B1 * 5/2002 Wicker et al. ........... 156/345.1
6,432,255 B1 * 8/2002 Sun et al. ................ 156/345.1
6,432,261 B2 * 8/2002 Watanabe et al. ...... 156/345.47
6,433,484 B1 * 8/2002 Hao et al. ............... 315/111.21
6,969,953 B2 * 11/2005 Schaepkens ........... 315/111.21
2002/0074221 A1 * 6/2002 Mallinson et al. .......... 204/170
2004/0194885 A1 * 10/2004 Stacey et al. ............ 156/345.3

FOREIGN PATENT DOCUMENTS

| EP | 1 300 877 A1 | 4/2003 |
| JP | 9-199487 A | 7/1997 |
| JP | 2000-164570 A | 6/2000 |
| JP | 2002-299330 A | 10/2002 |

* cited by examiner

Primary Examiner—Michael Cleveland
Assistant Examiner—Keath T Chen
(74) Attorney, Agent, or Firm—Foley & Lardner LLP

(57) ABSTRACT

A substrate processing apparatus (10A) using a microwave plasma is disclosed wherein an inner partition wall (15) is provided within a process chamber (11) so that the inside of the process chamber (11) is divided into a space (11A) where a substrate to be processed is housed and a space (11B) which is defined by the inner partition wall (15) and the outer wall of the process chamber (11). By having such a structure, contamination of the substrate by a gas separated from the sealing material and contamination of the substrate caused by abnormal discharge can be prevented, thereby enabling clean processing of the substrate.

11 Claims, 9 Drawing Sheets

PRIOR ART

US 7,374,620 B2

SUBSTRATE PROCESSING APPARATUS

TECHNICAL FIELD

This invention relates generally to a plasma processing apparatus and, in particular, relates to a microwave plasma processing apparatus.

Plasma processing processes and plasma processing apparatuses are the essential technique for the manufacture of ultra-miniaturized semiconductor devices each a so-called deep submicron device or deep subquarter micron device having a gate length approximate to or not greater than 0.1 μm in recent years and the manufacture of high-resolution flat-panel display devices including liquid-crystal display devices.

As the plasma processing apparatuses for use in the manufacture of the semiconductor devices or the liquid-crystal display devices, various plasma exciting methods have conventionally been used and, particularly, parallel-plate radio-frequency plasma processing apparatuses or inductively coupled plasma processing apparatuses are popular. However, these conventional plasma processing apparatuses have a problem that plasma formation is non-uniform and regions of high electron density are limited so that it is difficult to carry out uniform processing over the whole surface of a processing substrate at high processing speed, i.e. high throughput. This problem becomes serious particularly when processing large-diameter substrates. Further, these conventional plasma processing apparatuses have some essential problems like generation of damage to a semiconductor element formed on a processing substrate due to high electron temperature, large metal contamination due to sputtering of a processing chamber wall, and so on. Therefore, with the conventional plasma processing apparatuses, it is getting difficult to satisfy strict demands for further miniaturization and further improvement in productivity of the semiconductor devices or the liquid-crystal display devices.

On the other hand, there have conventionally been proposed microwave plasma processing apparatuses without a DC magnetic field using a high-density plasma excited by a microwave electric field. For example, there has been proposed a plasma processing apparatus having a structure where a microwave is radiated into a processing chamber from a planar antenna (radial line slot antenna) having a number of slots arranged so as to generate a uniform microwave, thereby ionizing a gas in the vacuum chamber by the use of the microwave electric field to excite a plasma.

With the microwave plasma excited by such a technique, the high plasma density can be realized over a wide region right under the antenna so that it is possible to implement uniform plasma processing in a short time. Further, with the microwave plasma formed by such a technique, it is possible to avoid damage to and metal contamination of a processing substrate because of a low electron temperature since the plasma is excited by the microwave. Moreover, since a uniform plasma can be easily excited even on a large-area substrate, it is also possible to easily cope with the manufacturing process of a semiconductor device using a large-diameter semiconductor substrate or the manufacture of a large-size liquid-crystal display device.

BACKGROUND ART

FIG. 1 shows a structure of a plasma processing apparatus 10 being a conventional substrate processing apparatus.

Referring to FIG. 1, the plasma processing apparatus 10 comprises a processing chamber 11 having a space 11a defined inside, and a holding table 13 provided in the processing chamber 11 for holding a processing substrate 12 by the use of an electrostatic chuck.

The space 11a in the processing chamber 11 is exhausted/decompressed by an exhaust appratus such as a vacuum pump through exhaust ports 11D formed at at least two positions, preferably at three or more positions, at regular intervals so as to surround the holding table 13, i.e. in a substantially axisymmetric relationship with respect to the processing substrate 12 on the holding table 13.

A microwave transmissive window 17 serving to transmit a microwave is provided at a portion, in the outer wall of the processing chamber 11, corresponding to the processing substrate 12 and a plasma gas supply ring 20 serving to introduce a plasma gas into the processing chamber 11 is inserted between the microwave transmissive window 17 and the processing chamber 11. The microwave transmissive window 17 and the plasma gas supply ring 20 form the outer wall of the processing chamber 11.

It is configured that the microwave transmissive window 17 has a stepped shape at its peripheral portion and the airtightness in the processing space 11a is ensured by engagement between the stepped shape and a stepped shape provided on the plasma gas supply ring 20 and further by a seal ring 16A.

The plasma gas is introduced into the plasma gas supply ring 20 from a plasma gas introduction port 20A and diffused into a gas groove 20B formed in an approximately annular shape. The plasma gas in the gas groove 20B is supplied to the space 11a through a plurality of plasma gas holes 20C communicating with the gas groove 20B.

On the microwave transmissive window 17 is provided a radial line slot antenna 30 comprising a disk-shaped slot plate 18 brought into tight contact with the microwave transmissive window 17 and formed with a number of slots, a disk-shaped antenna body 22 retaining the slot plate 18, and a phase delay plate 19 made of a low-loss dielectric material such as $Al_2O_3$, $SiO_2$, or $Si_3N_4$ and held between the slot plate 18 and the antenna body 22. Further, it is configured that the airtightness is ensured by a seal ring 16B at an engaging portion between the radial line slot antenna 30 and the microwave transmissive window 17.

The radial line slot antenna 30 is mounted on the processing chamber 11 through the plasma gas supply ring 20 and a microwave having a frequency of 2.45 GHz is supplied to the radial line slot antenna 30 from an external microwave source (not shown) through a coaxial waveguide 21.

The supplied microwave is radiated into the processing chamber 11 through the slots of the slot plate 18 and the microwave transmissive window 17 to thereby excite a plasma in the plasma gas, supplied through the plasma gas supply ring 20, in the space 11a right under the microwave transmissive window 17.

Of the coaxial waveguide 21, an outer waveguide 21A is connected to the disk-shaped antenna body 22 and an inner conductor 21B is connected to the slot plate 18 through an opening portion formed in the phase delay plate 19. Accordingly, the microwave supplied to the coaxial waveguide 21A is radiated through the slots while proceeding radially between the antenna body 22 and the slot plate 18.

In the plasma processing apparatus 10, it is possible to carry out a plasma oxidation process, a plasma nitridation process, a plasma oxynitridation process, or a plasma CVD process and, by applying a radio-frequency voltage to the holding table 13 from a radio-frequency power supply 13A, it is also possible to perform reactive ion etching to the processing substrate 12.

Such a plasma processing apparatus is described, for example, in Japanese Unexamined Patent Application Publication (JP-A) No. 2002-299330.

However, for example, in the plasma processing apparatus 10, there are cases where contaminants enter at the time of the substrate processing to contaminate the processing substrate 12.

For example, typically, there are cases where gas generated from the seal rings 16A and 16B containing fluoro rubber or the like as a main component causes the contamination of the processing substrate 12.

Moisture, organic matter, and further metal or the like adhere to the surface of the seal rings 16A and 16B and moisture, organic matter, etc. also exist inside them. If these contaminants are released from the seal rings and such outgas adheres to the processing substrate 12 during the substrate processing, a serious problem arises, for example, in the semiconductor manufacturing process or the like.

Further, in the plasma processing apparatus 10 introducing the microwave, there have been cases where, for example, in the processing chamber 11, microwave electric fields are concentrated to corner portions or the like formed inside the processing chamber 11 to thereby cause abnormal discharge. A problem has arisen that when such abnormal discharge is generated, the substrate processing becomes unstable and, further, impurities containing metal, for example, are produced due to the abnormal discharge to thereby contaminate the processing substrate 12.

Further, when the film formation process is implemented in the plasma processing apparatus 10, deposits are deposited in the processing chamber 11. The deposits are removed by carrying out a cleaning process. However, a problem has arisen that those portions such as, for example, corners inside the processing chamber 11 where the cleaning is difficult exist in the processing chamber 11 and thus complete removal of the deposits is difficult so that the processing substrate 12 is contaminated by particles of the stripped deposits which were deposited in the processing chamber 11.

It is a general object of this invention to provide a substrate processing apparatus that solves the foregoing problems and enables clean substrate processing eliminating contamination of a processing substrate.

It is a specific object of this invention to enable clean substrate processing eliminating the influence of outgas released from a seal material of a seal ring, etc. in a substrate processing apparatus.

It is another object of this invention to eliminate abnormal discharge in a substrate processing apparatus to thereby enable stable and clean substrate processing.

It is another object of this invention to improve the cleaning in a substrate processing apparatus so as to completely remove deposits generated at the time of film formation, thereby enabling clean substrate processing free of the influence of stripping of the deposits.

DISCLOSURE OF THE INVENTION

According to this invention, it is configured that, in a substrate processing apparatus 10A using a microwave plasma, an inner partition wall 15 is provided in a processing chamber 11 so that the inside of the processing chamber 11 is divided into a space 11A containing a processing substrate and a space 11B defined by the inner partition wall 15 and an outer wall of the processing chamber 11. With this configuration, there is provided the substrate processing apparatus that can eliminate the influence of contamination of the processing substrate due to outgas from a seal material and further suppress the problems of contamination of the processing substrate due to abnormal discharge and so on, thereby enabling clean substrate processing free of the influence of stripping of deposits.

BEST MODE FOR CARRYING OUT THE INVENTION

Figure 1:
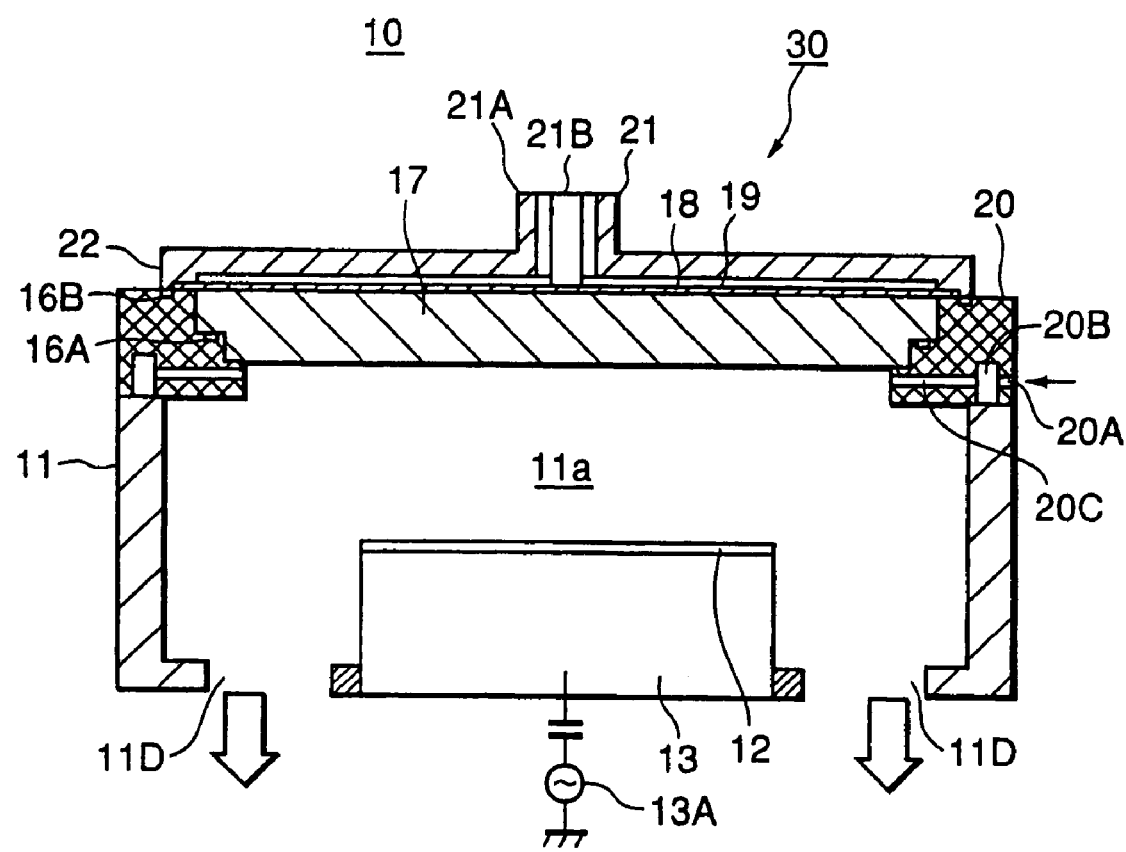
FIG. 1 is a diagram showing an outline of a conventional plasma processing apparatus.

Now, referring to the drawings, description will be made in detail about embodiments of a substrate processing apparatus according to this invention.

First Embodiment

Figure 2:
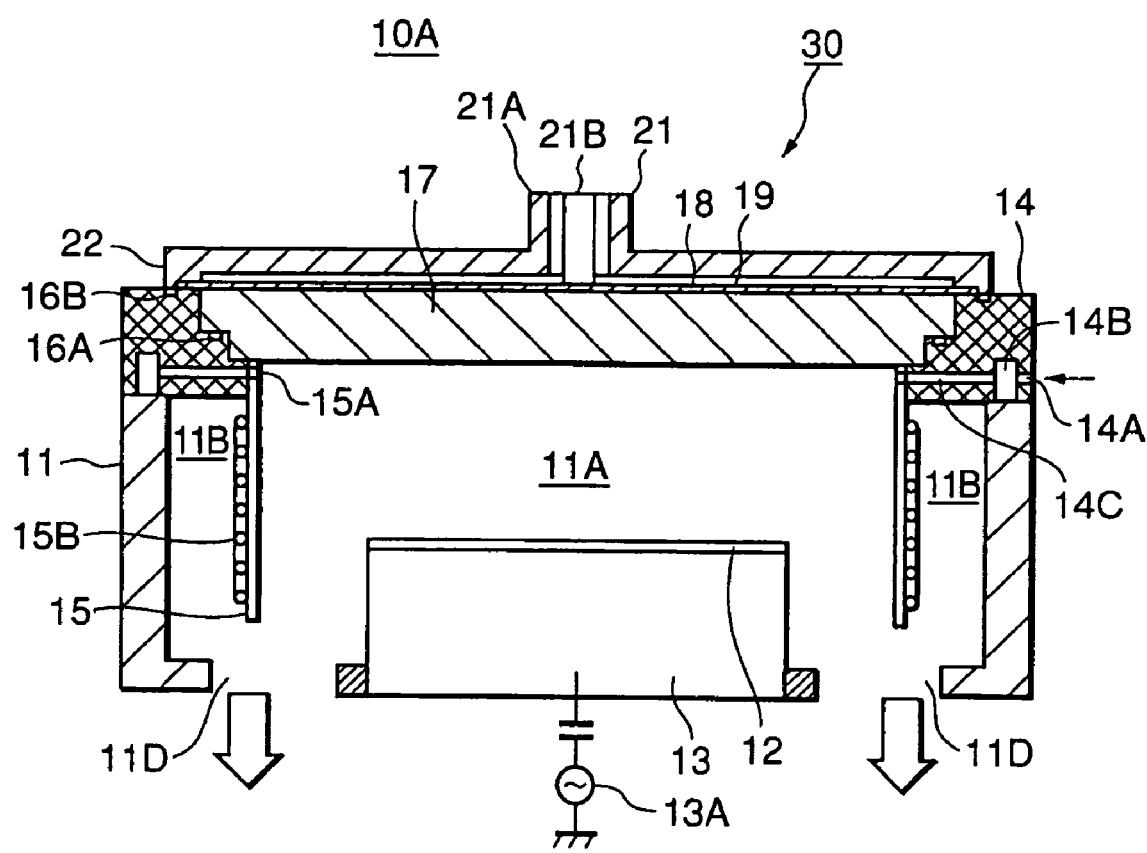
FIG. 2 is a diagram showing an outline of a substrate processing apparatus according to this invention.

FIG. 2 shows a structure of a plasma processing apparatus 10A being a substrate processing apparatus according to a first embodiment of this invention. In the figure, the same reference symbols are assigned to those portions that have been described before in FIG. 1, thereby omitting description thereof.

Referring to FIG. 2, in the plasma processing apparatus 10A, a plasma gas supply ring 14 for introducing a plasma gas into the processing chamber 11 is inserted between the microwave transmissive window 17 and the processing chamber 11 so as to define the outer wall of the processing chamber 11 and, further, an approximately cylindrical inner partition wall 15 is attached to the plasma gas supply ring 14. The inner partition wall 15 is engagingly attached to a partition wall attaching portion of the plasma gas supply ring 14 and the microwave transmissive window 17.

The space in the processing chamber 11 is divided by the inner partition wall 15 into 11A being a space at a center portion provided with the holding table 13 and a space 11B formed between the inner partition wall 15 and the outer wall of the processing chamber 11.

The spaces 11A and 11B forming the inside of the processing chamber 11 are exhausted/decompressed by the exhaust apparatus such as the vacuum pump through the exhaust ports 11D.

It is configured that the microwave transmissive window 17 has a stepped shape at its peripheral portion and the airtightness in the processing chamber 11 is ensured by engagement between the stepped shape and a stepped shape provided on the plasma gas supply ring 14 and further by the seal ring 16A.

The plasma gas is introduced into the plasma gas supply ring 14 from a plasma gas introduction port 14A and diffused into a gas groove 14B formed in an approximately annular shape. The plasma gas in the gas groove 14B is supplied to the space 11A through a plurality of plasma gas holes 14C communicating with the gas groove 14B and further through plasma gas supply holes 15A formed in the inner partition wall 15 attached to the partition wall attaching portion of the plasma gas supply ring 14.

The inner partition wall 15 is made of an approximately cylindrical conductor, for example, a stainless alloy and a heater 15B is attached onto the outer side of the inner partition wall 15, i.e. the side facing the outer wall of the processing chamber 11, so that it is possible to heat the inner partition wall 15. Further, it is configured that the inner partition wall 15 is electrically connected to the plasma gas supply ring 14 so as to be grounded through the plasma gas supply ring 14.

Also in the plasma processing apparatus 10A, like in the foregoing plasma processing apparatus 10, a microwave having a frequency of 2.45 GHz is supplied to the radial line slot antenna 30 from the external microwave source (not shown). The supplied microwave is radiated into the processing chamber 11 through the slots of the slot plate 18 and the microwave transmissive window 17 to thereby excite a plasma in the plasma gas, supplied through the plasma gas supply ring 14, in the space 11A.

As described before, in the plasma processing apparatus 10A, by exciting the microwave plasma, it is possible to carry out, for example, a plasma oxidation process, a plasma nitridation process, a plasma oxynitridation process, or a plasma CVD process and, by applying a radio-frequency voltage to the holding table 13 from the radio-frequency power supply 13A, it is also possible to perform reactive ion etching to the processing substrate 12.

Next, description will be made about a structure of the inner partition wall 15.

Second Embodiment

Figure 3:
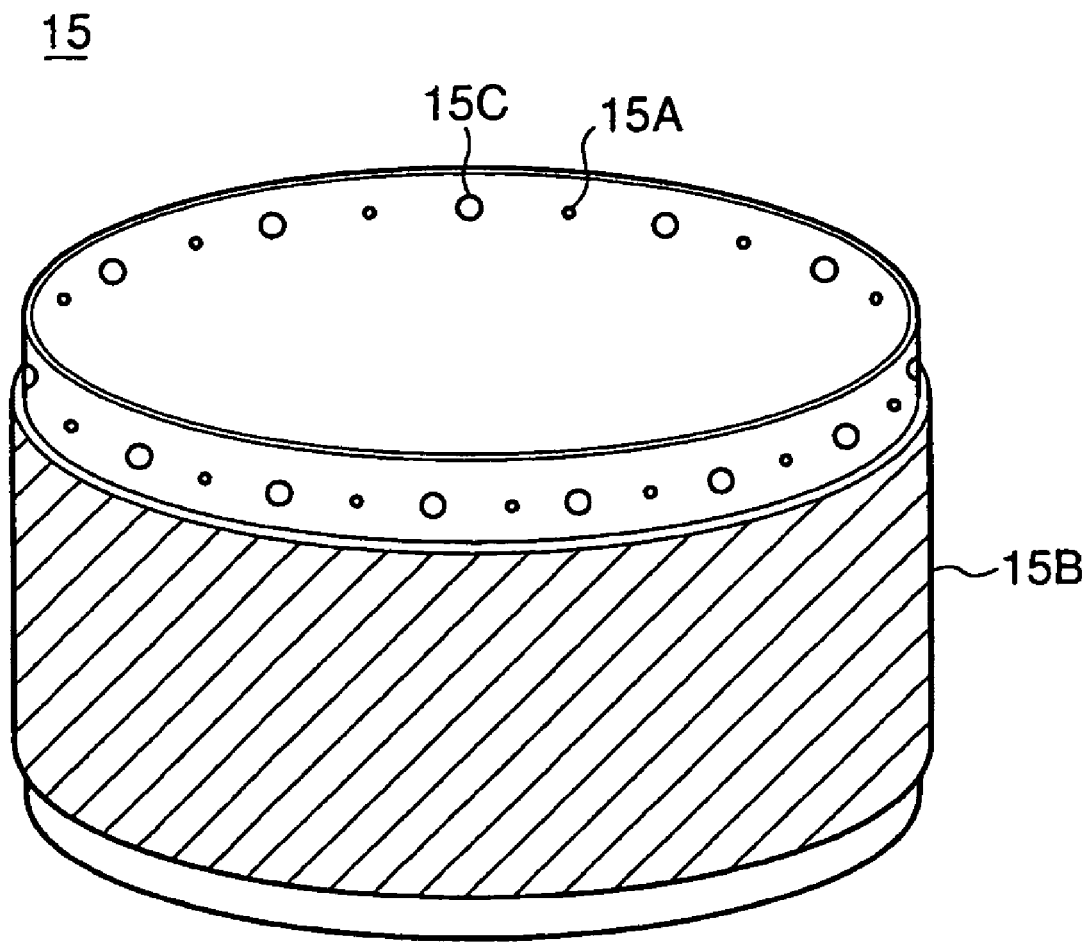
FIG. 3 is a perspective view of an inner partition wall used in the substrate processing apparatus of FIG. 2.

FIG. 3 is a perspective view of the inner partition wall 15. In the figure, the same reference symbols are assigned to those portions described before, thereby omitting description thereof.

It is configured that the inner partition wall 15 is made of the approximately cylindrical conductor, for example, the stainless alloy and the heater 15B is attached onto its side facing the outer wall of the processing chamber 11 so that it is possible to heat the inner partition wall 15.

The inner partition wall 15 is formed at its end portion with the plasma gas supply holes 15A for allowing the plasma gas supplied from the plasma gas holes 14C to pass therethrough so as to be supplied to the space 11A.

The plasma gas supply holes 15A are configured so as to correspond to the plasma gas holes 14C formed in the plasma gas supply ring 14 when the inner partition wall 15 is attached to the plasma gas supply ring 14 so that the plasma gas is supplied to the space 11A from the gas groove 14B through the plasma gas holes 14C and further through the plasma gas supply holes 15A.

Screw through holes 15C are formed so as to be adjacent to the plasma gas supply holes 15A. It is configured that screws are inserted into the screw through holes 15 to thereby fix the inner partition wall 15 to the plasma gas supply ring 14 as will be described later.

Next, description will be made about the plasma gas supply ring 14 to be fixed with the inner partition wall 15.

Third Embodiment

Figure 4:
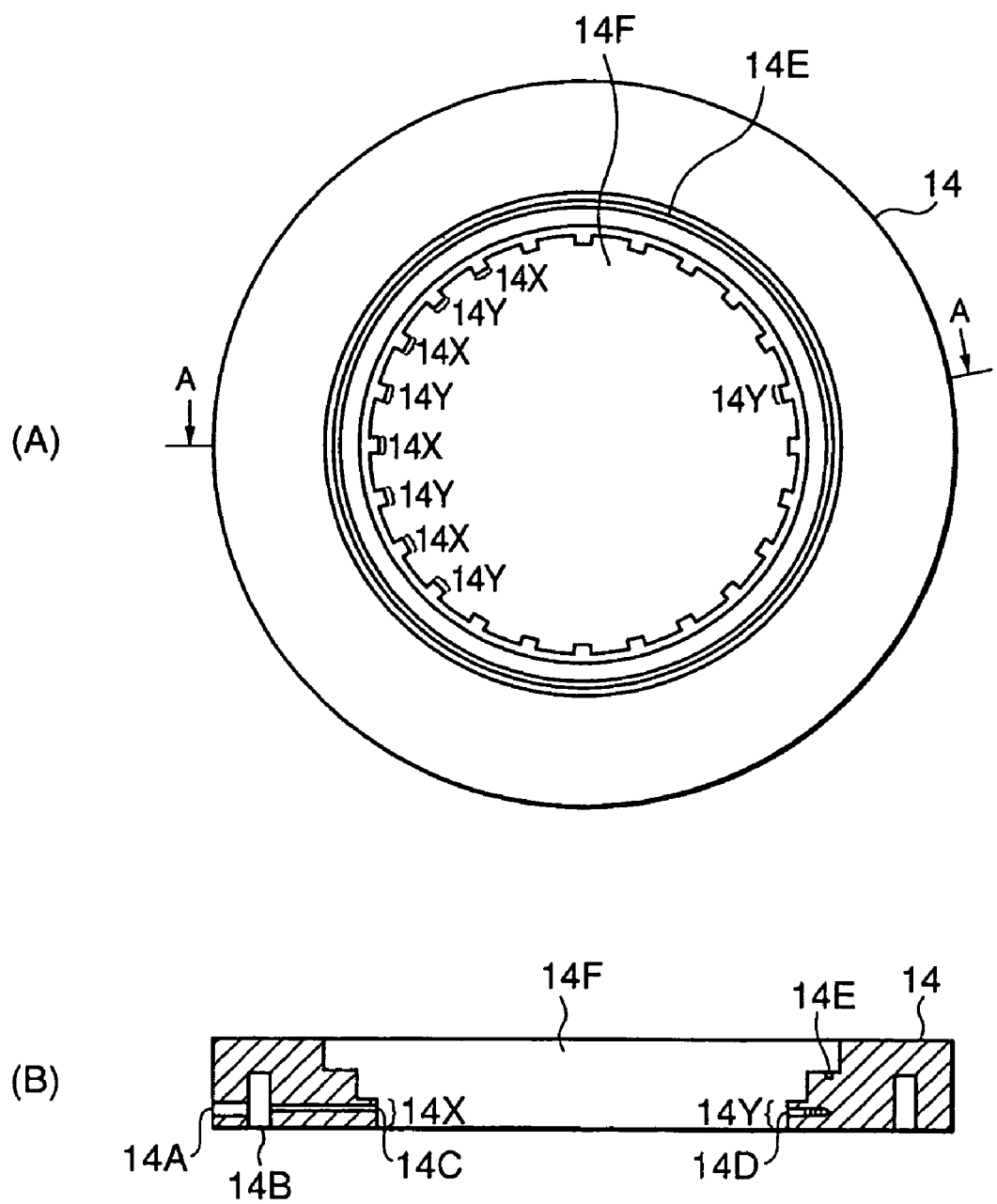
FIGS. 4(A) and 4(B) are a plan view and a sectional view showing a plasma gas supply ring used in the substrate processing apparatus of FIG. 2.

FIGS. 4(A) and 4(B) show the plasma gas supply ring 14, wherein FIG. 4(A) is a plan view and FIG. 4(B) is a sectional view taken along A-A shown in FIG. 4(A).

Referring to FIGS. 4(A) and 4(B), the plasma gas supply ring 14 has an approximately disk shape formed with a center space 14F such that the space 14F forms part of the space 11A when the plasma gas supply ring 14 is installed in the plasma processing apparatus 10A.

It is configured that, as described before, the plasma gas supply ring 14 is formed with the stepped shape from its side facing the space 14F toward its peripheral portion so that its stepped shape engages the stepped shape of the microwave transmissive window 17.

Further, an approximately ring-shaped ring groove 14E for insertion of the seal ring 16A is formed at the stepped shape portion of the plasma gas supply ring 14 on the side facing the microwave transmissive window 17. The seal ring 16A is inserted into the ring groove 14E so that the airtightness in the processing chamber 11 is ensured.

On the side, facing the space 14F, of the plasma gas supply ring 14, i.e. on the side facing the space 11A when the plasma gas supply ring 14 is installed in the plasma processing apparatus 10A, there are formed gas supply blocks 14X and fixing blocks 14Y that engage the inner partition wall 15.

Each gas supply block 14X is formed with the plasma gas hole 14C leading to the gas groove 14B from the side, facing the space 14F, of the gas supply block 14X. It is configured that the plasma gas supplied from the plasma gas supply port 14A is diffused into the gas groove 14B formed in the approximately annular shape, and supplied to the space 11A from the plasma gas holes 14C through the plasma gas supply holes 15A of the inner partition wall 15 attached to the plasma gas supply ring 14.

Further, it is configured that the fixing blocks 14Y are each formed with a screw hole 14D so that the inner partition wall 15 is fixed to the plasma gas supply ring 14 by means of the screws.

Nex, referring to FIG. 5, description will be made about an attaching method of fixing the inner partition wall 15 to the plasma gas supply ring 14.

Figure 5:
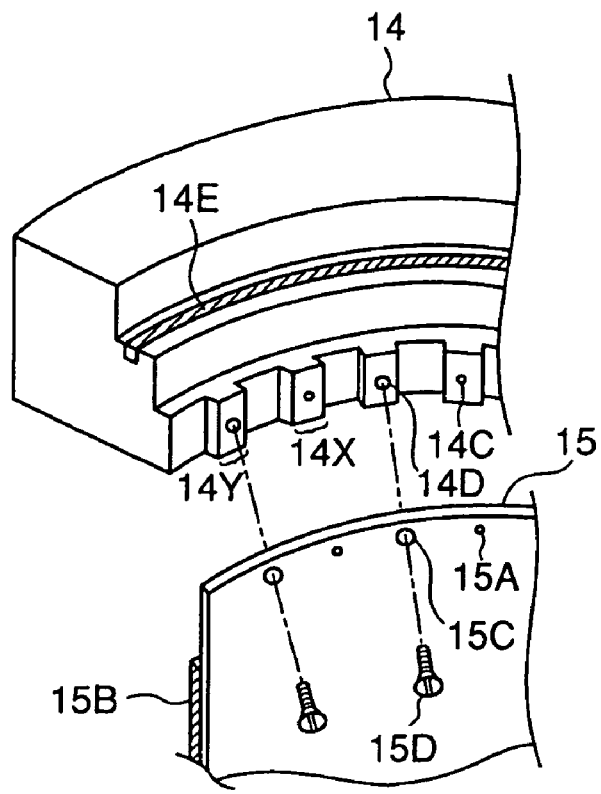
FIG. 5 is a perspective view showing an attaching method of attaching the inner partition wall to the plasma gas supply ring, which are used in the substrate processing apparatus of FIG. 2.

FIG. 5 shows the attaching method of fixing the inner partition wall 15 to the plasma gas supply ring 14 and is a partially sectional view of a perspective view of the plasma gas supply ring 14 and the inner partition wall 15. In the figure, the same reference symbols are assigned to those portions described before, thereby omitting description thereof.

Referring to FIG. 5, when attaching the inner partition wall 15 to the plasma gas supply ring 14, the fixation therebetween is achieved by passing screws 15D through the screw through holes 15C and inserting the screws 15D into the screw holes 14D. In this event, it is configured that the plasma gas supply holes 15A communicates with the plasma gas holes 14C.

It is configured that the fixing blocks 14Y are adjacent to the gas supply blocks 14X, respectively. The plurality of fixing blocks 14Y and the plurality of gas supply blocks 14X provided at the partition wall attaching portion of the plasma gas supply ring 14 serve as contact blocks so that the inner partition wall 15 is engagingly attached to the partition wall attaching portion of the plasma gas supply ring 14 and the microwave transmissive window.

Next, description will be made about a structure when the inner partition wall 15 is fixed to the plasma gas supply ring 14.

Fourth Embodiment

Figure 6:
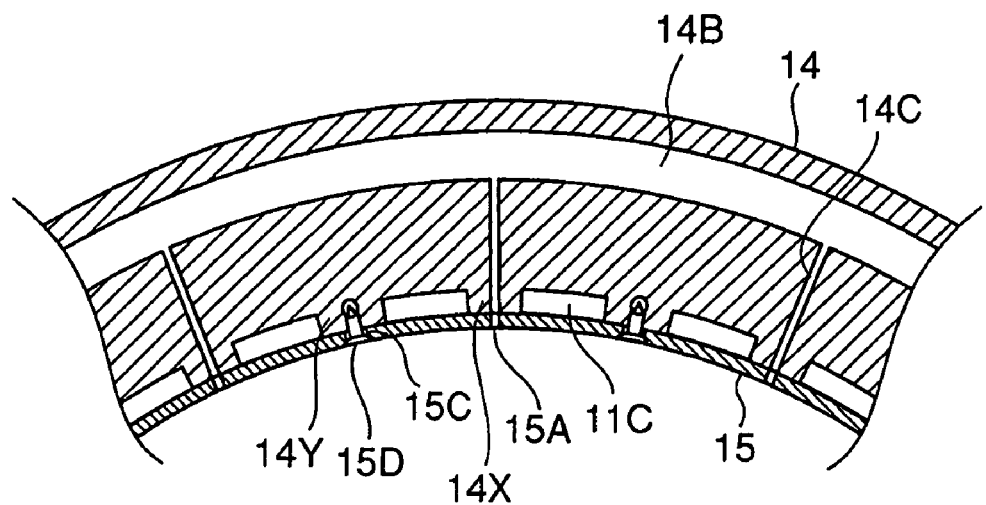
FIG. 6 is a sectional view showing the state where the inner partition wall is attached to the plasma gas supply ring, which are used in the substrate processing apparatus of FIG. 2.

FIG. 6 is a sectional view showing the state where the inner partition wall 15 is fixed to the plasma gas supply ring 14 by the screws 15D. In the figure, the same reference symbols are assigned to those portions described before, thereby omitting description thereof.

Referring to FIG. 6, the state is observed where the inner partition wall 15 is pressed and fixed to the fixing blocks 14Y by the screws 15D. In this state, the fixing blocks 14Y and the gas supply blocks 14X engage the inner partition wall 15 so that the inner partition wall 15 is electrically connected to the plasma gas supply ring 14. It is configured that the plasma gas supply ring 14 is in the form of a grounded conductor so that the inner partition wall 15 is grounded through the plasma gas supply ring 14.

Further, exhaust passages 11C are formed between the adjacent gas supply blocks 14X and fixing blocks 14Y, respectively. The exhaust passages 11C each communicate with a later-described space 11F being a gap between the plasma gas supply ring 14 and the microwave transmissive window 17 which are sealed therearound by the seal ring 16A.

It is configured that outgas from the seal ring 16A is exhausted from the space 11F, through the exhaust passages 11C, to the space 11B and further to the exhaust ports 11D.

Accordingly, the gas released from the seal ring 16A does not stay in the space 11F and thus is efficiently exhausted from the exhaust space 11F so that the processing substrate 12 is prevented from being contaminated by the outgas during the substrate processing.

Next, referring to FIG. 7, description will be made about details of the structure that eliminates the influence of the outgas from the seal ring 16A as described above.

Fifth Embodiment

Figure 7:
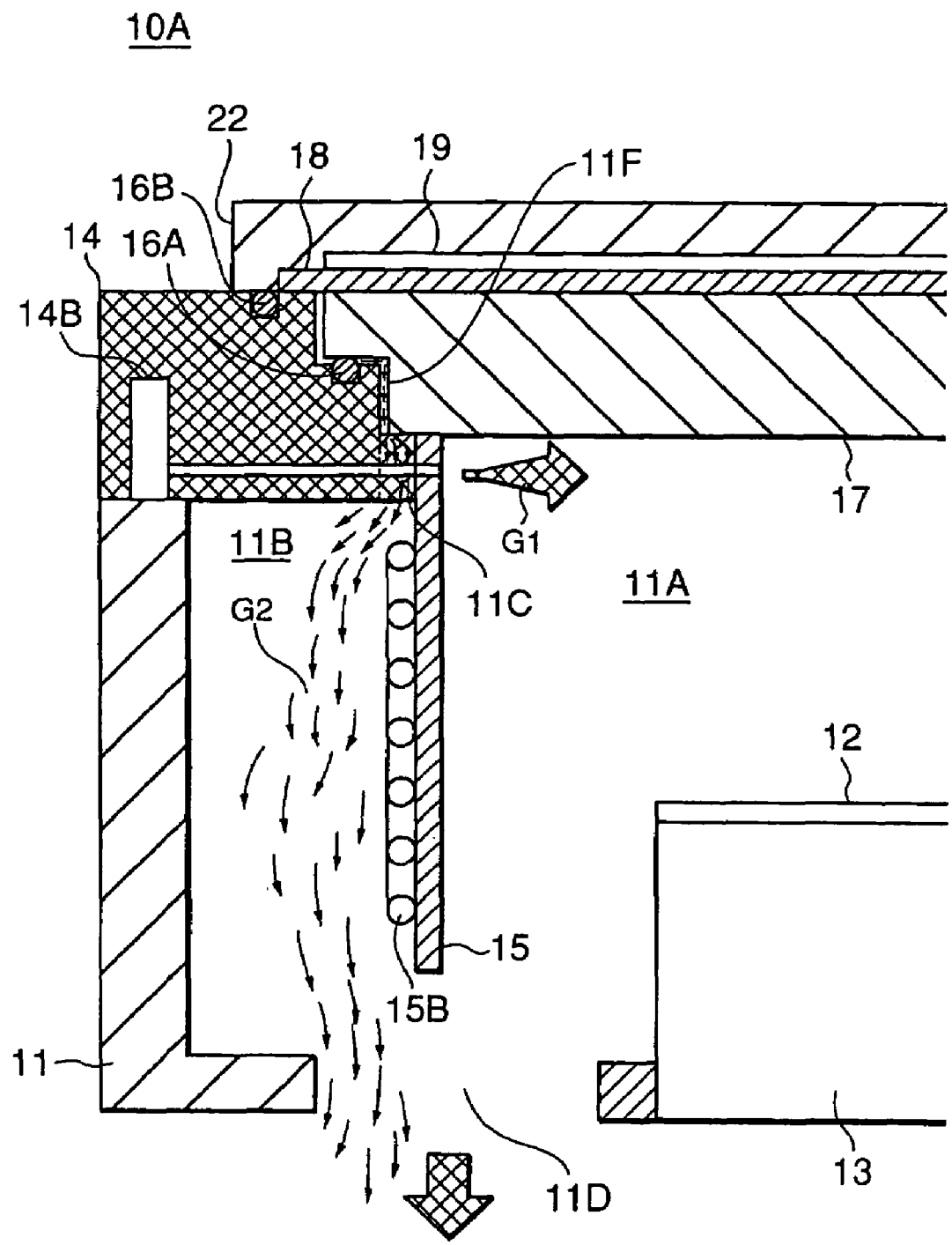
FIG. 7 is a diagram showing the state where outgas from a seal ring used in the substrate processing apparatus of FIG. 2 is exhausted.

FIG. 7 shows, in an enlarged scale, part of the sectional view of the plasma processing apparatus 10A shown in FIG. 2. In the figure, the same reference symbols are assigned to those portions described before, thereby omitting description thereof.

Referring to FIG. 7, it is considered that an outgas G2 produced by separation, from the seal ring 16A, of impurities such as moisture, organic matter, and metal compound adhering to the surface of the seal ring 16A or existing inside the seal ring 16A mainly exists in the space 11F formed in a gap between the microwave transmissive window 17 and the plasma gas supply ring 14 and sealed therearound by the seal ring 16A.

The space 11F is evacuated through the exhaust passages 11C and the space 11B and further through the exhaust ports 11D as described above.

It is configured that when the outgas G2 is exhausted through the inside of the processing chamber 11, the exhaust passages 11C and the space 11B where the outgas G2 passes are separated by the inner partition wall 15 from the space 11A where the processing substrate 12 is processed.

Accordingly, the processing substrate 12 can be processed without contamination thereof by the outgas G2 released from the seal ring 16A.

There are cases where the outgas G2 contains the atmospheric components entering from the exterior of the processing chamber 11 through the seal ring 16A. However, as shown in this embodiment, it is configured that such atmospheric components, i.e. the impurities such as moisture and nitrogen, are prevented from entering the space 11A, thereby preventing contamination of the processing substrate 12.

To enable the clean processing with less contamination of the processing substrate as described above is effective, for example, in the manufacture of a semiconductor device, particularly in a gate insulating film formation process of a transistor such as a gate oxide film formation process, gate oxide film nitridation process, or gate oxynitride film formation process of an MOS transistor with which contamination particularly arises as a problem.

On the other hand, in the case of the plasma processing apparatus 10A, there are cases where the temperature of the microwave transmissive window 17 becomes high when the microwave is introduced into the processing chamber 11. Further, as will be described later, there are cases where the temperature of respective portions of the plasma processing device 10A such as the inner partition wall 15 is raised in order to reduce the adhesion amount of a film during film formation or improve the cleaning rate of an adhering film.

In this case, it is considered that the temperature of the seal ring 16A rises to increase the influence of the outgas from the surface or inside of the seal ring as described above.

Also in such a case, in this embodiment, since it is configured that the outgas from the seal ring 16A is exhausted through the space isolated from the neighborhood of the processing substrate 12, the processing substrate 12 is not contaminated. That is, as described before, when the seal ring 16A is exposed to the high temperature, the configuration of exhausting the outgas from the seal ring 16A in the manner isolated from the processing substrate is particularly effective.

Further, it is configured that since a plasma gas G1 is introduced into the space 11A, the space 11A is higher in pressure than the spaces 11C and 11B so that the outgas G2 is prevented from entering the space 11A through a slight clearance of the engaging portion between the inner partition wall 15 and the microwave transmissive window 17.

Further, when the microwave is introduced into the processing chamber 11 from the radial line slot antenna 30 through the microwave transmissive window 17, there is an effect that abnormal discharge in the processing chamber 11 is prevented by the inner partition wall 15.

The microwave introduced into the processing chamber 11 is diffused into the processing chamber 11 through the microwave transmissive window 17. There are cases where when, for example, a projection or clearance exists in the space where the microwave electric field is strong as referred to above, the electric field is concentrated thereto to cause abnormal discharge.

Further, there are cases where when a conductor in an electrically floating state or in a state of insufficient grounding exists in the microwave electric field, the potential difference is locally generated to cause abnormal discharge, for example, at a portion where the potential is lower than the conductor, for example, between the outer wall of the processing chamber 11 and the plasma gas supply ring 14. When the abnormal discharge is generated, there are cases where the substrate processing becomes unstable and, further, a contaminant containing, for example, metal vaporized due to high temperature is produced at the abnormal discharge portion to thereby contaminate the processing substrate.

In this embodiment, it is configured that the inner partition wall 15 exists so as to cover the region where the microwave electric field is strong, thereby preventing a clearance, a projection, or the like, which causes abnormal discharge in the processing chamber 11, from being directly exposed to the strong microwave electric field. Further, it is configured that the inner partition wall 15 is electrically connected to the grounded plasma gas supply ring 14 so as to have a ground potential, thereby not causing abnormal discharge.

As described before, the inner partition wall 15 is electrically connected to the gas supply blocks 14X and the fixing blocks 14Y of the plasma gas supply ring 14 so as to be grounded through the plasma gas supply ring 14. It is configured that, particularly, the inner partition wall 15 is pressed to the fixing blocks 14Y by means of the screws 15D so that the inner partition wall 15 is securely connected to the fixing blocks 14Y electrically so as to be grounded.

Consequently, as described before, the abnormal discharge in the processing chamber 11 is suppressed to enable the stable substrate processing and, further, the generation of the contaminant due to the abnormal discharge is suppressed to enable the clean substrate processing.

As a method of grounding the plasma gas supply ring 14, a grounding conductor may be directly connected to the plasma gas supply ring 14 or a method of grounding through the processing chamber 11 may be adopted.

Sixth Embodiment

Figure 8:
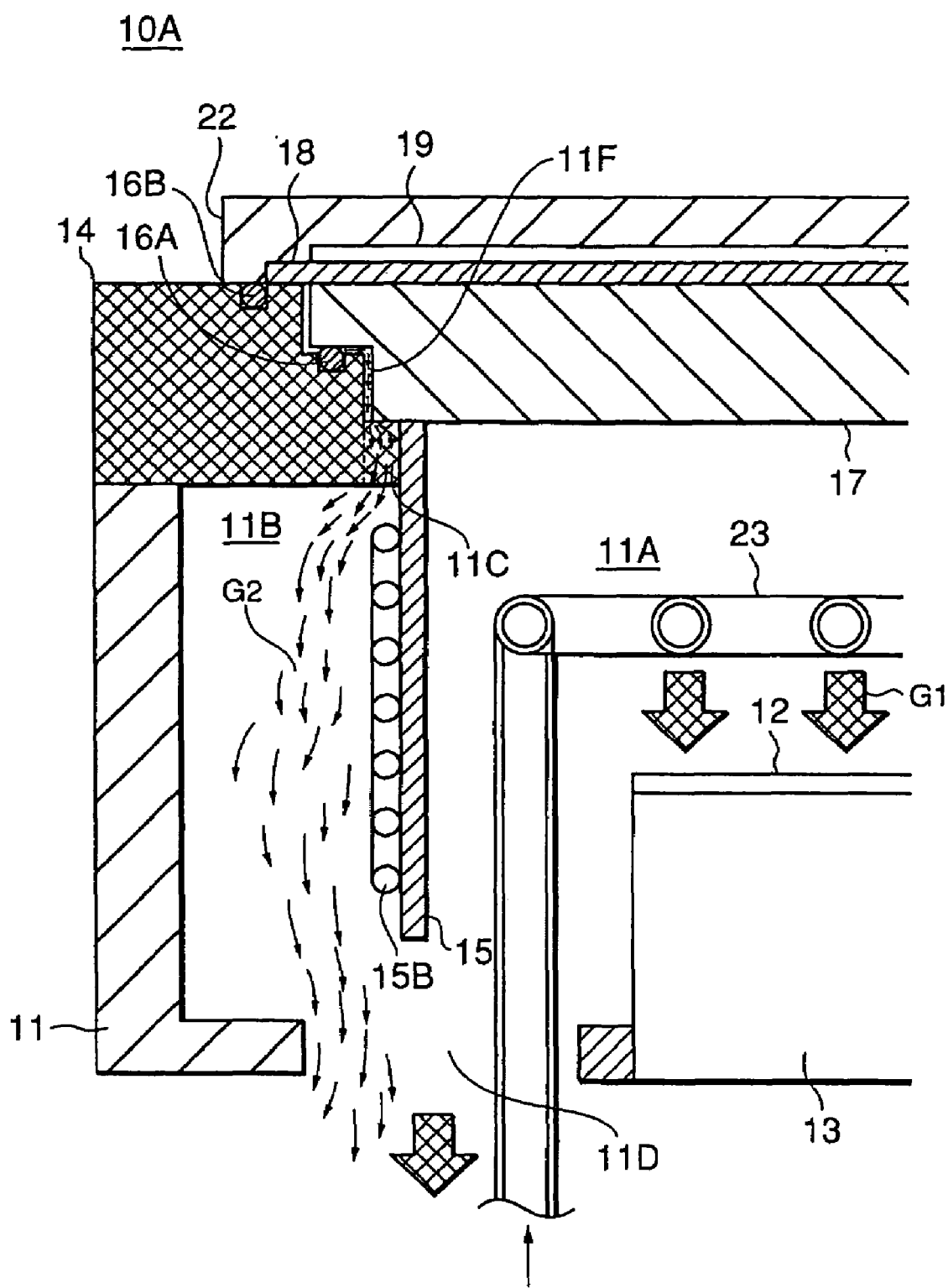
FIG. 8 is a diagram showing a modification (first) of the substrate processing apparatus of FIG. 2.

It is also possible to carry out the foregoing fifth embodiment by changing it as shown in FIG. 8. FIG. 8 shows a sixth embodiment of this invention. In the figure, the same reference symbols are assigned to those portions described before, thereby omitting description thereof.

In this embodiment, there is provided a plasma gas supply structure 23 for supplying a plasma gas to the plasma processing apparatus and the plasma gas is introduced into the processing chamber by the use of the plasma gas supply structure 23. Accordingly, the gas groove 14 and the plasma gas holes 14C provided in the plasma gas supply ring 14 and the plasma gas supply holes 15A of the inner partition wall become unnecessary.

The plasma gas supply structure 23 is provided so as to stand upright in the processing chamber and supplies the plasma gas between the microwave transmissive window 17 and the processing substrate 12.

In this embodiment, since it is configured that, in addition to the effect described in the fifth embodiment, the supply path of the plasma gas is further away from the exhaust path of the outgas G2 from the seal ring 16A, the processing space 11A is further free of the influence of contamination due to the outgas G2 and so on.

Seventh Embodiment

Figure 9:
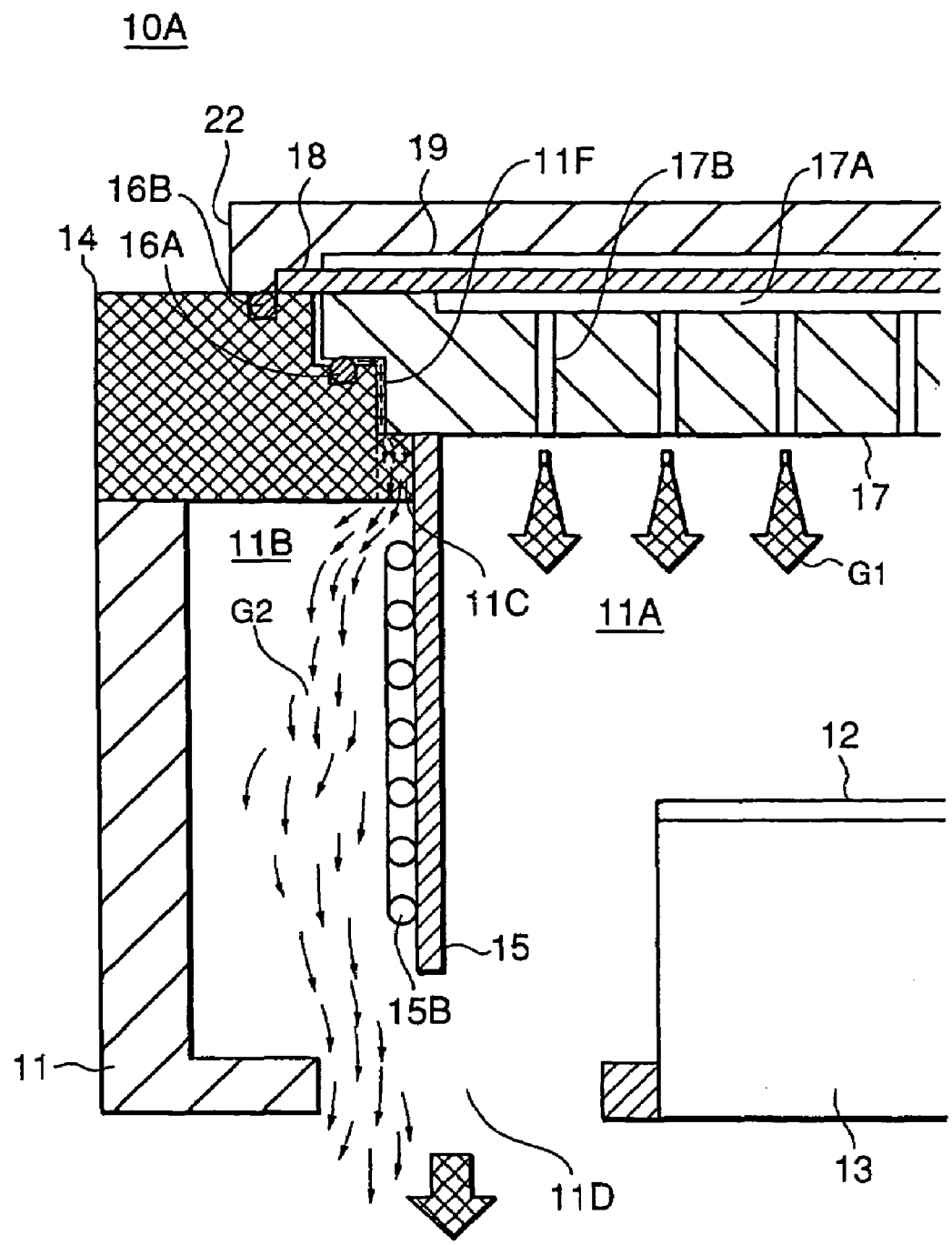
FIG. 9 is a diagram showing a modification (second) of the substrate processing apparatus of FIG. 2.

It is also possible to carry out the foregoing fifth embodiment by changing it as shown in FIG. 9. FIG. 9 shows a seventh embodiment of this invention. In the figure, the same reference symbols are assigned to those portions described before, thereby omitting description thereof.

In this embodiment, for supplying a plasma gas to the plasma processing apparatus, the microwave transmissive window 17 is formed with a plasma gas passage 17A serving as introduction paths for the plasma gas and a plurality of opening portions 17B communicating with the plasma gas passage 17A and with the space 11A to thereby introduce the plasma gas into the processing chamber. Accordingly, the gas groove 14 and the plasma gas holes 14C provided in the plasma gas supply ring 14 and the plasma gas supply holes 15A of the inner partition wall become unnecessary.

In this embodiment, like in the sixth embodiment, since it is configured that, in addition to the effect described in the fifth embodiment, the supply path of the plasma gas is further away from the exhaust path of the outgas G2 from the seal ring 16A, the processing space 11A is further free of the influence of contamination due to the outgas G2 and so on.

Eighth Embodiment

Figure 10:
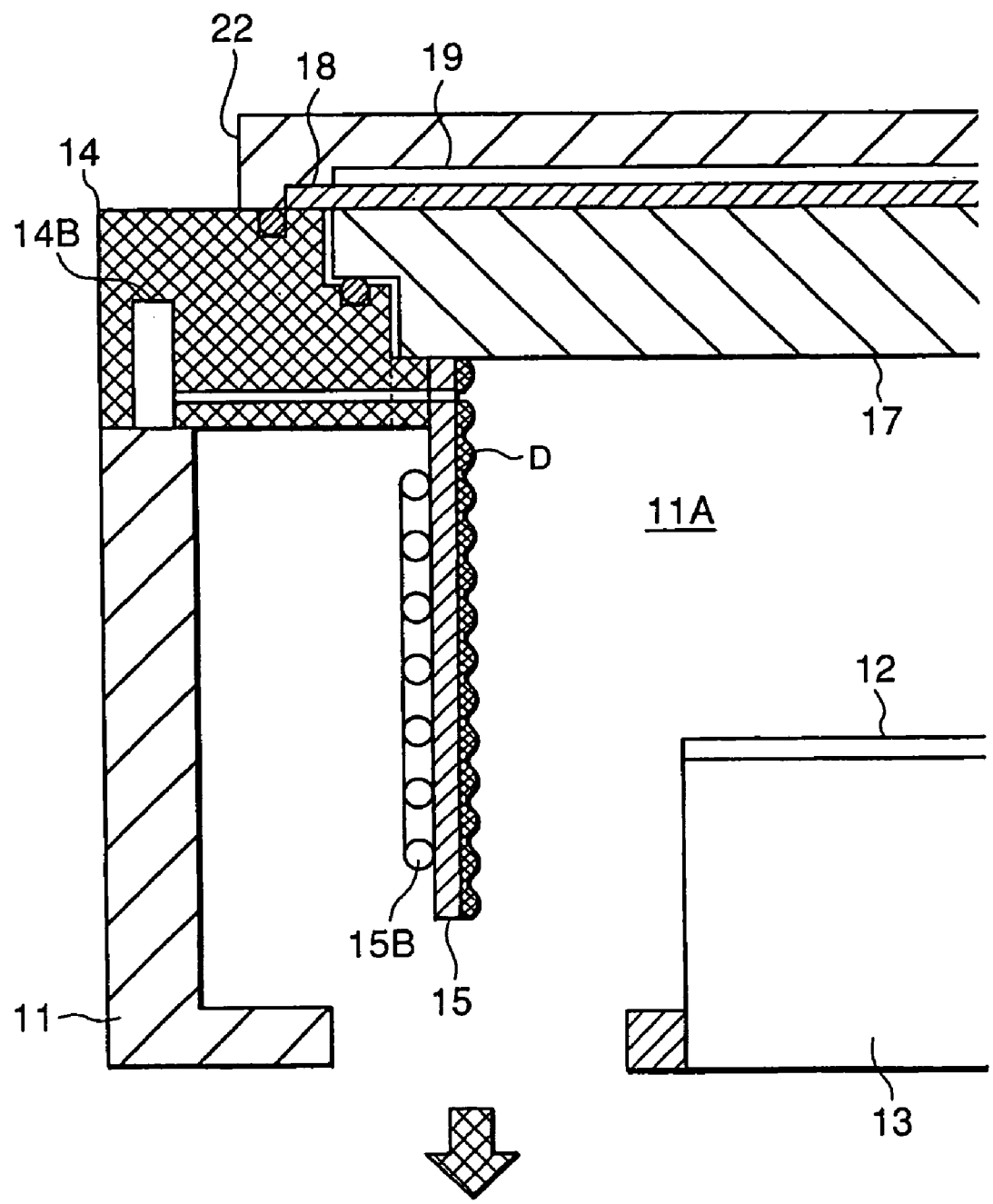
FIG. 10 is a diagram showing the state where a film is deposited after film formation is implemented in the substrate processing apparatus of FIG. 2.

Next, FIG. 10 shows the case where film formation such as a plasma CVD process is carried out in the plasma processing apparatus 10A.

FIG. 10 is part of a sectional view when the film formation is carried out in the plasma processing apparatus 10A. In the figure, the same reference symbols are assigned to those portions described before, thereby omitting description thereof.

Referring to FIG. 10, deposits D are deposited on the side of the inner partition wall 15 facing the processing substrate 12, i.e. the side facing the space 11A. When the film formation such as the plasma CVD is implemented in the plasma processing apparatus 10A, the film formation is achieved for the processing substrate 12 and, simultaneously, the deposits are deposited also in the processing chamber 11.

For example, in the case of a plasma CVD process for forming a fluorine-added carbon film, the fluorine-added carbon film (CxFy film) can be formed on the processing substrate by supplying Ar, $H_2$, and $C_4F_8$ to the plasma gas and introducing the microwave into the plasma processing apparatus 10A. The formed fluorine-added carbon film can be used as an insulating film of a semiconductor device such as, for example, an interlayer insulating film.

When the deposits deposited in the processing chamber 11 are accumulated in the film formation process implementing film formation on the processing substrate as described above, the deposits are stripped to become fine grains such as particles and stay in the processing chamber 11 to contaminate the processing substrate 12, thereby causing a reduction in yield of the processing substrate 12. Therefore, the so-called cleaning process becomes necessary to remove the deposits regularly.

For example, when implementing the foregoing fluorine-added carbon film formation process, it is necessary to remove the deposits made of the fluorine-added carbon film. In this case, if the deposition amount of the deposited fluorine-added carbon film is small, cleaning frequency can be less and a cleaning time can be shorter when performing the cleaning, thus resulting in high efficiency of the substrate processing. In the case of the fluorine-added carbon film, the deposition amount at a high-temperature portion tends to be less.

When cleaning the deposited fluorine-added carbon film, the cleaning is carried out by using $H_2$ and $O_2$ as cleaning gases and Ar as a diluent gas and introducing a microwave. When performing such cleaning, there is a tendency that the etching rate of the fluorine-added carbon film to be removed is high and thus the cleaning rate is high when the temperature of the fluorine-added carbon film is high. Therefore, it is advantageous in view of the efficiency of the substrate processing to heat a portion where the deposits are deposited when performing the film formation process and the cleaning process.

However, for example, even by heating the whole of the substrate processing apparatus 10A to raise the temperature, there is a limit due to the influence of heat radiation and, also in terms of a problem of heat resistance of the seal material, 100 to 150° C. or so is a limit.

Further, even by heating the whole of the substrate processing apparatus 10A, since there are those portions where the temperature is low such as, for example, corners or corner portions of the processing chamber 11, the deposits cannot be removed and are thus accumulated to generate particles, thereby causing contamination of the processing substrate.

In the case of this example, it is configured that the inner partition wall 15 covers the outer wall of the processing chamber 11 to thereby hide the corner portions and the like of the processing chamber 11 where it is difficult to raise the temperature. Further, the heater 15B is provided on the inner partition wall 15 so that the inner partition wall 15 can be heated. Accordingly, as described before, the deposition amount of the fluorine-added carbon film is small even when the film formation is carried out and, further, the etching rate of the fluorine-added carbon film is fast when the cleaning is performed so that the cleaning time can be shortened, thereby enabling the efficient substrate processing.

Further, since the inner partition wall 15 is configured so as to cover those portions where it is difficult to raise the temperature such as the corner portions of the processing chamber 11 where the fluorine-added carbon film tends to stay, it becomes possible to completely remove the fluorine-added carbon film and, therefore, the clean substrate processing is enabled by eliminating the influence of particles caused by stripping of the deposits and thus eliminating the influence of contamination of the processing substrate 12 caused by the particles.

As described before, as the temperature of the inner partition wall 15 is raised, the deposits are reduced and the cleaning rate can be increased so that it is advantageous in view of the efficiency of the substrate processing. In this embodiment, by minimizing an area of contact with the inner partition wall 15 which is heated to a high temperature, the thermal insulation of the inner partition wall 15 is improved to thereby enable the high temperature of the inner partition wall 15.

That is, in this embodiment, it is configured that only the side, facing the space 14F, of the fixing blocks 14Y and the gas supply blocks 14X is in contact with the inner partition wall 15 so that the inner partition wall 15 is electrically grounded as described before while minimizing the contact area.

Accordingly, the contact area for heat conduction is small when the inner partition wall 15 is heated to the high temperature and, further, heat transfer by gas molecules is small due to decompression of the inside of the processing chamber 11 so that the heat quantity radiated from the inner partition wall 15 is small.

As a result, when, for example, an electric heater is used as the heater 15B, the inner partition wall 15 can be maintained at a high temperature of, for example, about 200 to 400° C. with a small input power. Further, while maintaining the inner partition wall 15 at the high temperature, the peripheral members such as, for example, the plasma gas supply ring 14 and the processing chamber 11 can be maintained at low temperatures so that the safety of the plasma processing apparatus 10A is ensured.

Moreover, the seal ring 16A typically containing the fluoro rubber as the main material has a heat-resistant temperature of about 100 to 150° C. and it becomes possible to keep the seal ring 16A at 100° C. or less, i.e. the heat-resistant temperature or less.

While this invention has been described in terms of the preferred embodiments, this invention is not to be limited to the foregoing specific embodiments and various modifications and changes can be made within the gist as recited in claims.

INDUSTRIAL APPLICABILITY

According to this invention, in the substrate processing apparatus using a microwave plasma that can easily excite a uniform plasma even on a large-area substrate, the inside of the processing chamber 11 is configured so as to be divided into the space 11A including the processing substrate and the space 11B defined by the inner partition wall and the outer wall of the processing chamber. Accordingly, there is obtained the substrate processing apparatus that eliminates the influence of contamination of the processing substrate due to the outgas from the seal material to thereby enable the clean substrate processing. In view of this, the substrate processing apparatus is suitable for use in the manufacturing process of semiconductor devices using large-diameter semiconductor substrates or the manufacturing process of large-size liquid-crystal display devices.

The invention claimed is:

1. A substrate processing apparatus comprising:
    a processing chamber defined by an outer wall and provided with a holding table for holding a processing substrate,
    an exhaust port for exhausting the inside of said processing chamber,
    a microwave transmissive window provided on said processing chamber as part of said outer wall so as to face said processing substrate,
    a microwave antenna provided on said microwave transmissive window and electrically connected to a microwave power supply,
    a plasma gas supply portion for supplying a plasma gas into said processing chamber,
    an inner partition wall formed so as to surround said holding table, and
    a partition wall attaching portion inserted between said processing chamber and said microwave transmissive window to form part of said outer wall and attached with said inner partition wall,
    said inner partition wall being directly attached to said partition wall attaching portion and said microwave transmissive window and dividing a space inside said processing chamber into a first space containing said holding table and a second space defined by said outer wall and said inner partition wall, and a gap between said microwave transmissive window and said partition wall attaching portion being exhausted through said second space.

2. A substrate processing apparatus according to claim 1, characterized in that said partition wall attaching portion includes said plasma gas supply portion that supplies said plasma gas to said first space.

3. A substrate processing apparatus according to claim 1, characterized in that said partition wall attaching portion includes a plurality of contact blocks engaging said inner partition wall and said gap is exhausted through a third space formed between said plurality of contact blocks.

4. A substrate processing apparatus according to claim 3, characterized in that part of said plurality of contact blocks are fixing blocks each formed with a screw hole and configured such that said inner partition wall is fixed to said partition wall attaching portion by insertion of screws into said screw holes.

5. A substrate processing apparatus according to claim 3, characterized in that part of said plurality of contact blocks are gas supply blocks each formed with a plasma gas hole serving as a flow path for said plasma gas.

6. A substrate processing apparatus according to claim 5, characterized in that said plasma gas holes communicate with said first space to thereby supply said plasma gas to said first space.

7. A substrate processing apparatus according to claim 5, characterized in that said fixing blocks and said gas supply blocks are configured so as to be adjacent to each other.

8. A substrate processing apparatus according to claim 3, characterized in that said inner partition wall is electrically connected to said partition wall attaching portion by engagement with said contact blocks.

9. A substrate processing apparatus according to claim 8, characterized in that said partition wall attaching portion is in the form of a grounded conductor and said inner partition wall is grounded through said partition wall attaching portion.

10. A substrate processing apparatus according to any claim 1, characterized in that said inner partition wall is provided with a heating mechanism for heating said inner partition wall.

11. A substrate processing apparatus according to claim 10, characterized in that said heating mechanism is provided on a side of said inner partition wall facing said outer wall.

* * * * *